United States Patent
Inokuti

(10) Patent No.: US 6,811,900 B2
(45) Date of Patent: Nov. 2, 2004

(54) UNIDIRECTIONAL SILICON STEEL SHEET OF ULTRA-LOW IRON LOSS AND METHOD FOR PRODUCTION THEREOF

(75) Inventor: Yukio Inokuti, Chiba (JP)

(73) Assignee: JFE Steel Corporation (JP)

( * ) Notice: Subject to any disclaimer, the term of this patent is extended or adjusted under 35 U.S.C. 154(b) by 0 days.

(21) Appl. No.: 10/343,206

(22) PCT Filed: May 29, 2002

(86) PCT No.: PCT/JP02/05219

§ 371 (c)(1),
(2), (4) Date: Jan. 28, 2003

(87) PCT Pub. No.: WO02/097146

PCT Pub. Date: Dec. 5, 2002

(65) Prior Publication Data

US 2003/0180554 A1 Sep. 25, 2003

(30) Foreign Application Priority Data

May 29, 2001 (JP) .......................................... 2001-159981

(51) Int. Cl.[7] .......................... B32B 15/00; C43C 14/00
(52) U.S. Cl. ....................... 428/698; 428/469; 428/472; 428/472.2; 148/113; 148/307; 148/308; 204/192.15
(58) Field of Search ................................. 148/113, 307, 148/308; 428/469, 472, 472.2, 6.98; 204/192.15

(56) References Cited

FOREIGN PATENT DOCUMENTS

| JP | 6-19115 | 3/1994 |
| JP | 6-73154 | 10/1994 |
| JP | 2001-32055 | 2/2001 |
| JP | 2002-129309 | 5/2002 |

*Primary Examiner*—Jennifer McNeil
(74) *Attorney, Agent, or Firm*—Piper Rudnick LLP

(57) ABSTRACT

When plural-layer ceramic coatings are formed on a surface of an grain-oriented silicon steel sheet after finish annealing according to the invention, TiNO coating is formed as a first coating layer by a hollow cathode process under an application of a high bias voltage to the steel sheet, whereby ceramic tension coatings having excellent coating adhesion property and hence tension applying effect can be formed.

As a result, ultra-low iron loss grain-oriented silicon steel sheets having an excellent iron loss property even after stress relief annealing at high temperatures for a long time can be stably obtained.

4 Claims, 7 Drawing Sheets

UNIDIRECTIONAL SILICON STEEL SHEET OF ULTRA-LOW IRON LOSS AND METHOD FOR PRODUCTION THEREOF

TECHNICAL FIELD

This invention relates to an ultra-low iron loss grain-oriented silicon steel sheet and a method of producing the same, and is to more improve the iron loss property by effectively improving properties and adhesion property of a first coating layer when a plurality of ceramic coating layers are formed on a surface of a silicon steel sheet after finish annealing.

BACKGROUND ART

In the production of the grain-oriented silicon steel sheets, there is recently proposed a method of producing an ultra-low iron loss grain-oriented silicon steel sheet by forming a thin ceramic tension coating such as TiN, $TiO_2$, CrN, TiC, Ti(C, N), $Si_3N_4$, $SiO_2$, AlN, Si system (Si—N—O—C) or the like on a surface of a grain-oriented silicon steel sheet having no forsterite undercoating (hereinafter referred to as a non-coating sheet) through a PVD process. A longtime pending issue in such a production method lies in a point that a ceramic tension coating having an adhesion property and bending properties durable to a stress relief annealing at a high temperature for a long time and capable of attaining an ultra-low iron loss without the deterioration of the iron loss feared in the stress relief annealing is effectively formed.

When the ceramic coating is formed on the surface of such a noncoating sheet through the PVD process, especially when a ceramic coating such as TiN, $TiO_2$, CrN, TiC, Ti(C, N) or the like is formed, a hollow cathode discharge process (HCD) having a low voltage-high current characteristic and an excellent ionization ratio on deposit particles is said to be optimum.

On the other hand, a magnetron sputtering process is said to be optimum in the formation of a ceramic coating such as $Si_3N_4$, $SiO_2$, AlN, Si system (S—N—O—C) or the like.

However, when the ceramic tension coating is directly formed on the non-coating sheet by using the conventional process as mentioned above, it is very difficult to obtain a ceramic coating keeping a sufficient adhesion property even after the stress relief annealing at a high temperature.

This is mainly considered due to the fact that since the ceramic coating formed by the PVD process is unstable as compared with naturally existing ceramics, the peeling is easily caused through the progress of reaction between the formed ceramic coating and the surface of the non-coating sheet in the high-temperature stress relief annealing.

The invention advantageously solves the above problems and is to propose an ultra-low iron loss grain-oriented silicon steel sheet provided with a ceramic tension coating having excellent adhesion property and bending properties even after the stress relief annealing at a high temperature for a long time and causing no deterioration of iron loss feared in such a stress relief annealing as a first object.

It is a second object of the invention to propose an advantageous method of producing an ultra-low iron loss grain-oriented silicon steel sheet provided with the ceramic tension coating as mentioned above.

DISCLOSURE OF THE INVENTION

The inventors have made various studies in order to achieve the above objects and obtained knowledge as mentioned below.

(1) The adhesion property is most important at an interface between the surface of the non-coating sheet and the ceramic tension coating formed by the PVD process. As a first coating layer (precoat), therefore, it is advantageous to form a ceramic coating having a very thin thickness and a somewhat large thermal expansion coefficient.

(2) In the formation of such a precoat ceramic coating, it is advantageous for enhancing the adhesion property to apply a large bias voltage to a substrate to adopt a coating process in which large and an ionization ratio is high.

(3) Upon said precoat ceramic coating, it is advantageous to use a ceramic tension coating having a small thermal expansion coefficient and serving as a diffusion barrier in the high-temperature stress relief annealing for effectively applying tension to a silicon steel sheet without deteriorating the adhesion property.

Further, it has been elucidated that it is effective to form a thin ceramic tension coating of TiN by a HCD process in order to satisfy the above requirement (1), and to apply a high bias voltage of not less than −100 V at this HCD process in order to satisfying the requirement (2), and to form $SiN_x$ by a magnetron sputtering process in order to satisfy the requirement (3), respectively.

As to the requirement (2) among the above requirements, however, it has been revealed that when a high bias voltage of not less than −100 V is directly applied to a substrate of a grain-oriented silicon steel sheet through rolls or the like in a high plasma atmosphere of the HCD process, abnormal discharge is frequently caused to spirally upheave the TiN coating and also many cracks are created on the upheaved TiN coating and hence the sufficient adhesion property is not obtained.

In order to solve the above problem, it is considered that the application of the bias voltage to the substrate of the grain-oriented silicon steel sheet is desirable to be a non-contact system.

Now, the inventors have made studies with respect to a method and an apparatus for attaining the application of the high bias voltage at a non-contact state and obtained the following knowledge.

a) The high bias voltage can be applied to the grain-oriented silicon steel sheet as a material to be treated at a non-contact state by arranging positive and negative electrodes in proximity to the material to be treated and disposing a magnetic field generating means in the vicinity of such positive and negative electrodes so that electrons generated between the positive and negative electrodes focus. Also, the high bias voltage can be applied to the substrate of the grain-oriented silicon steel sheet without causing abnormal discharge or the like by using such a non-contact type high bias voltage applying method.

b) The composition of the ceramic coating formed by the above method is not the conventional TiN but is TiNO. Also, the TiNO coating epitaxially grows and is formed on the steel sheet substrate in a good consistency, so that a further improvement of the adhesion property and hence tension applying effect is attained.

The invention is based on the above knowledge.

That is, the construction of the invention is as follows.

1. An ultra-low iron loss grain-oriented silicon steel sheet having a plurality of ceramic coating layers formed on a surface of a grain-oriented silicon steel sheet after finish annealing, characterized in that said steel sheet has a TiNO coating formed by a hollow cathode discharge process as a first coating layer.

2. An ultra-low iron loss grain-oriented silicon steel sheet having a plurality of ceramic coating layers formed on a surface of a grain-oriented silicon steel sheet after finish annealing, characterized in that said steel sheet has a TiNO coating formed by a hollow cathode discharge process as a first coating layer and further a $SiN_x$ coating formed by a magnetron sputtering process on the TiNO coating.

3. A method of producing an ultra-low iron loss grain-oriented silicon steel sheet by forming a plurality of ceramic coating layers on a surface of a grain-oriented silicon steel sheet after finish annealing without forming a forsterite undercoating on a surface of the steel sheet, characterized in that a TiNO coating is formed on a surface of the as finish annealed steel sheet as a first coating layer by a hollow cathode discharge process under an application of a high bias voltage of not less than −100 V to the steel sheet.

4. A method of producing an ultra-low iron loss grain-oriented silicon steel sheet by forming a plurality of ceramic coating layers on a surface of a uni-directional silicon steel sheet after finish annealing without forming a forsterite undercoating on a surface of the steel sheet, characterized in that a TiNO coating is formed on a surface of the as finish annealed steel sheet as a first coating layer by a hollow cathode discharge process under an application of a high bias voltage of not less than −100 V to the steel sheet and then a $SiN_x$ coating is formed on the TiNO coating by a magnetron sputtering process.

The invention will be concretely described below.

At first, a non-contact type high bias voltage applying apparatus suitable for use in the invention is explained.

In FIG. 1 is schematically shown a HCD apparatus incorporated with said non-contact type high bias voltage applying apparatus, in which numeral 1 is a vacuum tank, numeral 2 a material to be treated (grain-oriented silicon steel sheet), numeral 3 a positive electrode (+pole) arranged at a rear side of the material 2 and in proximity of the material 2, and similarly numeral 4 a negative electrode (−pole), and these electrodes are connected to a power circuit (not shown), respectively. Also, numeral 5 is a magnet for applying a magnetic field as a magnetic field generating means (electromagnet). The non-contact type high bias voltage applying apparatus is constructed with the above +pole 3, −pole 4 and magnet 5 for applying magnetic field. Numeral 6 is a group of electrons existing in a high density at a rear face of the material 2. Numeral 7 is a depositing ion (Ti ion) generated in the HCD apparatus. Further, numeral 8 is a Ta cathode, numeral 9 a HCD gun, numeral 10 an electron beam, numeral 11 a vaporizing source (molten Ti), and numeral 12 a crucible, which constitute the HCD apparatus.

Moreover, FIG. 1 shows a case that a cylindrical −pole is arranged around a linear +pole (disc-shape at its top portion) disposed perpendicular to the material 2 as +pole 3 and −pole 4, but the pole arrangement is not restricted thereto. As long as the poles are arranged in proximity of the material to be treated, any arranging structures may be taken. For instance, as shown in FIG. 2, it is particularly advantageous to use a housing 14 provided on its front face with many nozzle holes 13, in which convex +poles 15 are arranged on positions matching with the nozzle holes 13, while a frame of the housing 14 is −pole 16 and further a magnet 17 for applying a magnetic field is arranged on a rear face of the housing 14.

The high bias voltage applying apparatus having the above structure can generate electrons in a good directivity. Therefore, electron beams can be emitted toward desired positions in a good directivity. As a result, the arranging position of such a high bias voltage applying apparatus is not necessarily limited to the rear face side of the material to be treated. For example, as shown in FIG. 3, the apparatus can be arranged at an irradiation side of depositing ion (Ti ion) and at a side face side of the material 2.

Furthermore, when reactive gases such as $N_2$, $O_2$, $C_2H_2$, etc. are supplied to the inside of the housing 14 for the high bias voltage applying apparatus through a conduit 18 for the reactive gas, they can be directly ionized to provide $N^-$, $C^-$, $O^-$ ions and so on in a high density. As a result, it is possible to form a ceramic coating having a more excellent adhesion property.

Moreover, when a bias voltage is applied to the material to be treated through such a bias voltage applying apparatus, it is desirable that the bias voltage is about −100 to −3000 V (preferably about −150 to −2000 V). Because, as the bias voltage becomes higher, impact degree of the depositing ion to the steel sheet substrate is strong and the depositing ion deeply penetrate into the steel sheet and hence the adhesion property becomes more excellent.

In this case, it is preferable that an intensity of a magnetic field through a magnetic field generating means is about 50–1000 Gauss.

As a bias voltage applying power source, it is advantageous to use an arc cut power source or a pulse power source for lessening abnormal discharge in a high plasma atmosphere.

In FIG. 4 is shown a continuous ceramic coating installation of an in-line system suitable for carrying out the invention, which comprises a HDC apparatus incorporated with the above non-contact type high bias voltage applying apparatus, and a magnetron sputtering apparatus.

Moreover, the essential feature of the non-contact type high bias voltage applying apparatus and the HCD apparatus are common to those shown in FIGS. 1–3 and are shown by the same numerals as described above.

In FIG. 4, a zone (a) is an equipment for installing a grain-oriented silicon steel sheet coil as a material to be treated, which is divided into a preliminary evacuation chamber 19 for previously suctioning the preliminarily installed coil under vacuum and an unwinding chamber 20 for the coil.

Numeral 21 is a slit, which partitions zone (a) and zone (b).

The zone (b) is a chamber for forming TiNO coating through the HCD apparatus, at where TiNO coating are formed on both surfaces of the material 2 during the running of the material in an arrow direction. Numeral 22 is a deflector roll, and numeral 23 a device for supplying a Ti material.

A zone (c) is a chamber for forming various ceramic coatings through the magnetron sputtering apparatus, in which numeral 24 is a target, numeral 25 a magnet arranged at a rear side thereof, and numeral 26 a cooling band of the grain-oriented silicon steel sheet after the formation of the ceramic coating.

A zone (d) is an equipment for discharging the coil after the formation of the ceramic coating, which is divided into a winding chamber 27 of the coil and a discharging chamber 28 thereof.

Moreover, FIG. 4 shows a so-called vertical type magnetron sputtering apparatus for conducting the formation of ceramic coating on both surfaces of the steel sheet by vertically arranging the magnetron sputtering apparatuses in two rows. Hover, the magnetron sputtering apparatus is not limitative thereto. As shown in FIG. 5, a so-called lateral type apparatus may be used by laterally arranging the magnetron sputtering apparatuses in two rows.

Although the magnetron sputtering apparatus is used as a later-stage ion plating apparatus in FIGS. 4 and 5, the otherwise HCD apparatus, P-CVD (Plasma Chemical Vapor Deposition) apparatus, (EB (Electron Beam) +HCD) apparatus and so on may be used in the invention.

Further, the kind of the ceramic coating formed through the later-stage ion plating apparatus is not particularly limited. Various ceramic coatings including $SiN_x$ can be formed.

The production of the grain-oriented silicon steel sheet provided with the ceramic coating employing said equipment will be described below.

A continuously cast slab of silicon steel sheet having a composition comprising of C: 0.076 mass %, Si: 3.35 mass %, Mn: 0.076 mass %, Se: 0.020 mass %, Sb: 0.025 mass %, Al: 0.021 mass %, N: 0.0070 mass % and Mo: 0.012 mass % and the reminder being Fe and inevitable impurities is heated at 1350° C. for 4 hours and subjected to hot rolling to obtain a hot rolled sheet having a thickness of 2.0 mm. The hot rolled sheet is subjected to a homogenizing at 1050° C. for 2 minutes and further to two cold rollings sandwiching an intermediate annealing at 1050° C. therebetween to obtain a cold rolled sheet having a final thickness of 0.23 mm.

Then, the cold rolled sheet is subjected to a decarburization-primary recrystallization annealing in wet $H_2$ of 840° C., and a slurry of an annealing separator having a composition of MgO (20 mass %), $Al_2O_3$ (30 mass %), Sr(OH) (10 mass %), $NiCl_3$ (15 mass %), $CaSiO_3$ (5 mass %) and $SiO_2$ (20 mass %) is applied onto the surface of the steel sheet. Then, the decarburization-primary recrystallization annealed sheet is subjected to an annealing at 850° C. for 15 hours and the temperature is raised from 850° C. to 1100° C. at a rate of 12° C./h to develop secondary recrystallized grains strongly accumulated in a Goss orientation, and thereafter subjected to a purification treatment in dry $H_2$ of 1200° C. to produce silicon steel sheet having no forsterite coating.

Onto a surface of the thus obtained non-coating silicon steel sheet is first pre-coated by a TiNO coating of 0.1 μm in thickness under an application of a high bias voltage of −200 V to the steel sheet substrate by HCD process using the continuous ceramic coating equipment of in-line system shown in FIG. 4. Then, $SiN_x$ coating of 0.2 μm in thickness is formed by the magnetron sputtering process.

Thereafter, an insulating coating composed mainly of a phosphate and colloidal silica is applied and dried, and the sheet is subjected to a baking treatment at 815° C. in nitrogen atmosphere for 1 minute and further to a stress relief annealing at 800° C. in nitrogen atmosphere for 3 hours.

The thus obtained grain-oriented silicon steel sheet has the following magnetic properties and adhesion property:

$B_8$: 1.90T $W_{17/50}$: 0.53 W/kg

Adhesion property: no peeling even in 180° bending on a round rod of 15 mm in diameter.

For the comparison, the grain-oriented silicon steel sheet is produced by the usual production method of grain-oriented steel sheets wherein TiN coating of 0.1 μm in thickness is pre-coated onto the surface of the non-coating silicon steel sheet by the HCD process without applying bias voltage and $SiN_x$ coating of 0.2 μm in thickness is formed by the magnetron sputtering process and then stress relief annealing is conducted at 800° C. in nitrogen atmosphere for 3 hours in a similar manner, and the resulting grain-oriented silicon steel sheet is measured with respect to the magnetic properties and adhesion property to obtain the following results:

$B_8$: 1.90T $W_{17/50}$: 0.68 W/kg

Adhesion property: no peeling even in 180° bending on a round rod of 40 mm in diameter.

As seen from the above comparison, when the TiNO coating is pre-coated onto the grain-oriented silicon steel sheet at a non-contact state under an application of the high bias voltage of −200 V, it is noticed that the magnetic flux density is approximately the same as compared with a case of pre-coating by the TiN coating by the conventional method, but the iron loss is largely improved by $\Delta W_{17/50}$= 0.15 W/kg. In this case, the peeling is not caused in the bending of 15 mmϕ as to the adhesion property (minimum diameter causing no peeling even in 180° bending), so that it is noticed that the adhesion property is highly improved as compared with the case of applying no bias voltage.

In FIGS. 6a and 6b are results measured by X-ray diffractometry on the ceramic coating obtained by applying a high bias voltage of −200 V and the ceramic coating obtained without applying bias voltage, respectively.

In FIG. 6a are observed (111), (200) and (220) peaks of TiN and two peaks at a lower angle side thereof. Such two peaks are considered to be TiNO coating having a crystal structure shown in FIG. 7 from diffraction peaks corresponding to ½ and ¼ positions of the angle of (111) peak, respectively and the result of measurement by GDS (Glow Discharge Spectroscopy).

Moreover, only the peaks of TiN are observed in FIG. 6b.

As a silicon-containing steel used as a starting material according to the invention, any steels having the conventionally known composition are suitable. A typical composition is mentioned as follows.

C: 0.01–0.08 mass %

When C is less than 0.01 mass %, a hot rolled texture is not sufficiently controlled and largely elongated grains are formed and hence the magnetic properties are deteriorated, while when it is more than 0.08 mass %, a long decarburization time is taken at the decarburization step and is uneconomical. Therefore, the carbon amount is preferable to be about 0.01–0.08 mass %.

Si: 2.0–4.0 mass %

When Si is less than 2.0 mass %, sufficient electric resistance is not obtained and hence eddy current loss increases to bring about the deterioration of iron loss, while when it is more than 4.0 mass %, brittle cracks are easily created in the cold rolling. Therefore, the silicon amount is preferable to be a range of about 2.0–4.0 mass %.

Mn: 0.01–0.2 mass %

Mn is an important component to fix MnS or MnSe as a dispersed precipitation phase exerting on the secondary recrystallization of the grain-oriented silicon steel sheet. When the Mn amount is less than 0.01 mass %, an absolute amount of MnS or the like required for causing the recrystallization is lacking and hence incomplete secondary recrystallization is caused and at the same time surface defect called as blister increases. While, when the Mn amount exceeds 0.2 mass %, even if dissociation and solid solution are conducted in the heating of the slab or the like, the dispersed precipitation phase precipitated in the hot rolling is easily coarsened and hence optimum size distribution desired as an inhibitor is damaged to deteriorate the magnetic properties. Therefore, the Mn amount is preferable to be about 0.01–0.2 mass %.

S: 0.008–0.1 mass %, Se: 0.003–0.1 mass %

Each of S and Se is preferable to be not more than 0.1 mass %, and particularly S is a range of 0.008–0.1 mass % and Se is a range of 0.003–0.1 mass %. Because, when each of them exceeds 0.1 mass %, hot and cold workabilities are deteriorated, while when they are less than the lower limits, particular effect is not created in the function of inhibiting the primary grain growth as MnS, MnSe.

Besides, the effect of the invention is not obstructed even if Al, Sb, Cu, B and the like conventionally known as an inhibitor are added together.

The production steps of the ultra-low iron loss grain-oriented silicon steel sheet according to the invention will be described below.

At first, LD converters, electric furnaces, open-hearth furnaces and other known steel-making furnaces can be used but also vacuum melting or RH degassing treatment can be combined therewith for the melting of starting materials.

Any conventionally known methods can be used as a method of adding a slight amount of S, Se or other primary grain growth inhibiting agent included in the starting material to molten steel. For example, it can be added to molten steel in the LD converter or at a time of completing RH degassing or in the ingot making.

In the production of the slab, it is advantageous to adopt a continuous casting method in view of economic and technical advantages such as cost reduction, uniformity of components or quality in a longitudinal direction of the slab and the like, but the use of the conventional ingot slab is not obstructed.

The continuously cast slab is heated above 1300° C. for dissociating and solid soluting the inhibitors in the slab. Thereafter, the slab is subjected to hot rough rolling and further to hot finish rolling to obtain a hot rolled sheet usually having a thickness of about 1.3–3.3 mm.

Then, the hot rolled sheet is subjected to a hot rolled sheet annealing (which is also called as homogenizing) within a temperature range of about 850–1100° C., if necessary, and then subjected to one cold rolling or two cold rollings sandwiching an intermediate annealing therebetween up to a final sheet thickness. In this case, it is required to watch out for on a final cold rolling reduction (usually 55–90%) for obtaining products having characteristics such as high magnetic flux density and low iron loss.

That is, an upper limit of the product thickness is 0.5 mm from a viewpoint that eddy current loss of the silicon steel sheet is made small as far as possible, and a lower limit thereof is 0.05 mm for avoiding an adverse effect of hysteresis loss.

When linear grooves are formed on the surface of the steel sheet as a magnetic domain refining treatment for the reduction of iron loss, it is particularly advantageous to apply such a treatment to steel sheet having a product thickness after the final cold rolling.

That is, linear recess regions having a width of 50–500 $\mu$m and a depth of 0.1–50 $\mu$m are formed at intervals of 2–10 mm on the surface of the final cold rolled sheet or the steel sheet before or after the secondary recrystallization in a direction cross to the rolling direction.

The reason why the interval between the linear recess regions is limited to 2–10 mm is due to the fact that when the interval is less than 2 mm, irregularity of the steel sheet becomes too predominant and the magnetic flux density uneconomically lowers, while when it exceeds 10 mm, the magnetic domain refining effect becomes small.

Also, when the width of the recess region is less than 50 $\mu$m, it is difficult to utilize a demagnetizing field effect, while when it exceeds 500 $\mu$m, the magnetic flux density uneconomically lowers, so that the width of the recess region is limited to a range of 50–500 $\mu$m.

Furthermore, when the depth of the recess region is less than 0.1 $\mu$m, the demagnetizing field effect can not effectively be utilized, while when it exceeds 50 $\mu$m, the magnetic flux density uneconomically lowers, so that the depth of the recess region is limited to a range of 0.1–50 $\mu$m.

Moreover, the forming direction of the linear recess region is optimum to be a direction perpendicular to the rolling direction or a widthwise direction of the sheet, but substantially the same effect can be obtained within a range of ±30° with respect to the widthwise direction of the sheet.

As a method of forming the linear recess region, it is advantageous to use a method wherein an etching resist is applied by printing onto the surface of the final cold rolled sheet and baked and then subjected to an etching treatment and thereafter the resist is removed off. This method can be industrially and stably carried out as compared with the conventional method using a blade edge of a knife, a laser or the like, and has an advantage that the iron loss can be reduced more effectively by tensile strength.

Then, a typical example of the technique of forming the linear groove by the above etching is described in detail.

An etching resist ink composed mainly of an alkyd resin is applied onto the surface of the final cold rolled sheet by a gravure off-set printing so as to leave linear non-coated portions having a width of 200 $\mu$m at intervals of 4 mm in a direction substantially perpendicular to the rolling direction and then baked at 200° C. for about 20 seconds. In this case, the thickness of the resist is about 2 $\mu$m. The steel sheet coated with the etching resist is subjected to an electrolytic etching or a chemical etching to form linear grooves having a width of 200 $\mu$m and a depth of 20 $\mu$m and then immersed in an organic solvent to remove the resist. In this case, the electrolytic etching may be carried out in an electrolyte of NaCl at a current density of 10 A/dm$^2$ for a treating time of about 20 seconds, while the chemical etching may be carried out in a solution of HNO$_3$ for an immersing time of about 10 seconds.

Then, the steel sheet is subjected to a decarburization annealing. This annealing is conducted in a wet hydrogen atmosphere of, for example, 750–880° C. for the purpose that the cold rolled texture is substituted with a primary recrystallization texture and at the same time harmful C in the development of secondary recrystallization grains having {110}<001> orientation at a final annealing (which is also called as finish annealing) is removed.

The final annealing is to sufficiently develop the secondary re-crystallization grains of {110}<001> orientation, and is usually carried out by immediately raising a temperature above 1000° C. and keeping this temperature through box annealing. This final annealing is usually conducted while applying an annealing separator such as magnesia or the like, so that an under-coating called as forsterite is simultaneously formed on the surface. In the invention, however, even if the forsterite undercoating is formed, such an undercoating is removed at a subsequent step, so that it is advantageous to use an annealing separator not forming such a forsterite undercoating (non-coated silicon steel sheet). That is, in the annealing separator, it is advantageous that an including ratio of MgO forming the forsterite undercoating is decreased (not more than 50 mass %), while an including ratio of CaO, Al$_2$O$_3$, CaSiO$_3$, SiO$_2$, NiCl$_3$, Sr(OH) or the like not forming such an undercoating is increased (not less than 50 mass %).

In the invention, in order to develop the secondary recrystallization texture highly accumulated in {110}<001> orientation, a method of annealing by keeping a lower temperature of from 820° C. to 900° C. is advantageous, but an annealing by gradually heating at a temperature rising rate of about 0.5–15° C./h may be used.

Since the forsterite undercoating or oxide coating is not basically existent on the surface of the steel sheet after the purification annealing, the steel sheet is directly fed to a subsequent ceramic coating step or subjected to a light pickling treatment before the ceramic coating.

As mentioned above, the invention has a merit that the effect of sufficiently improving the iron loss can be developed after the finish annealing even if a smoothening treatment coming cost-up is not conducted or when the steel sheet is directly fed to the ceramic coating step or to the light pickling treatment before the coating.

However, it is unchangeable that the application of the smoothening treatment is advantageous, so that such a smoothening treatment is not prohibited.

At this stage, recess grooves can be formed on the surface of the steel sheet. As the method of forming such grooves may be used the same method as described in the case of applying onto the surface of the final cold rolled sheet or the steel sheet before or after the secondary recrystallization.

After the above treatment, a ceramic coating of TiNO is formed on the surface of the steel sheet as a first coating layer using HCD process having an excellent ionization ratio. In this case, the thickness of the TiNO pre-coating is about 0.005–0.5 $\mu$m, which is preferable to be about $\frac{1}{50}$–$\frac{1}{2}$ of a total coating thickness (preferably $\frac{1}{20}$–$\frac{1}{5}$).

Although the HCD process is an excellent means for ionization of $Ti^+$, in order to form a ceramic coating having an adhesion property, it is also important to ionize reactive gases such as nitrogen, oxygen and the like. For this end, as the high bias voltage applying apparatus, it is advantageous to use an apparatus capable of promoting the ionization of the reactive gases as shown in FIG. 2.

After the above pre-coating, ceramic tension coating of one or more layers are formed for increasing the tension applying effect.

In this case, the kind of ceramic tension coating for a second layer or above layers is not particularly limited, but it is preferable to serve as a diffusion barrier in the stress relief annealing at high temperatures. Especially, $SiN_x$, $SiO_2$, CrAlSiN, TiAlN, $TiO_2$, CrN and so on are advantageously adaptable.

Also, the thickness of the ceramic tension coating for the second layer or above layers is preferable to be about 0.05–0.5 $\mu$m in total.

Further, the magnetron sputtering apparatus is optimum as an apparatus for forming the ceramic tension coating for the second layer or above layers, but HCD apparatus, P-CVD (Plasma Chemical Vapor Deposition) apparatus, EB (Electron Beam) +HCD apparatus and so on may be used.

BEST MODE FOR CARRYING OUT THE INVENTION

Example 1

A continuously cast slab of silicon steel having a composition of C: 0.075 mass %, Si: 3.43 mass %, Mn: 0.076 mass %, Se: 0.020 mass %, Sb: 0.025 mass %, Al: 0.020 mass %, N: 0.0078 mass %, Mo: 0.012 mass % and the reminder being Fe and inevitable impurities is heated at 1350° C. for 4 hours and subjected to a hot rolling to obtain a hot rolled sheet having a thickness of 2.2 mm. Then, the hot rolled sheet is subjected to homogenizing at 1050° C. and further to two cold rollings sandwiching an intermediate annealing therebetween at 1000° C. to obtain a cold rolled sheet having a final thickness of 0.23 mm.

Next, the cold rolled sheet is subjected to decarburization-primary recrystallization annealing in a wet $H_2$ of 840° C., and a slurry of an annealing separator having a composition of MgO (40 mass %), $Al_2O_3$ (20 mass %), Sr(OH) (10 mass %), $NiCl_3$ (10 mass %), $CaSiO_3$ (5 mass %) and $SiO_2$ (15 mass %) is applied onto the surface of the steel sheet. Then, the decarburization-primary recrystallization annealed sheet is annealed at 850° C. for 15 hours and raised from 850° to 1050° C. at a rate of 12° C./h to develop secondary recrystallization grains strongly accumulated in a Goss orientation and subjected to purification annealing in a dry $H_2$ of 1200° C. to prepare a non-coating material.

Figure 1:
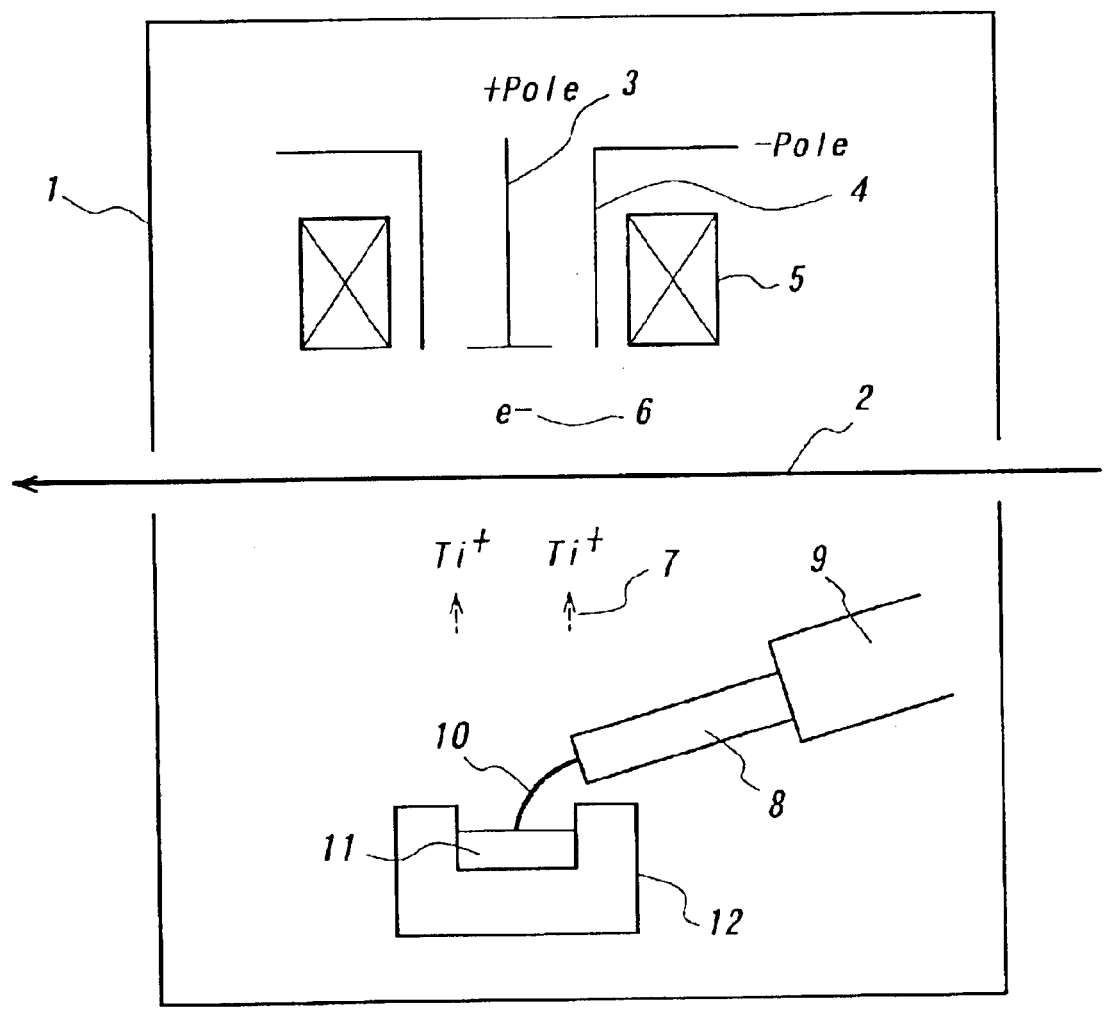
FIG. 1 is a schematic view of a HCD apparatus provided with a high bias voltage applying apparatus suitable for the invention.
Figure 2:
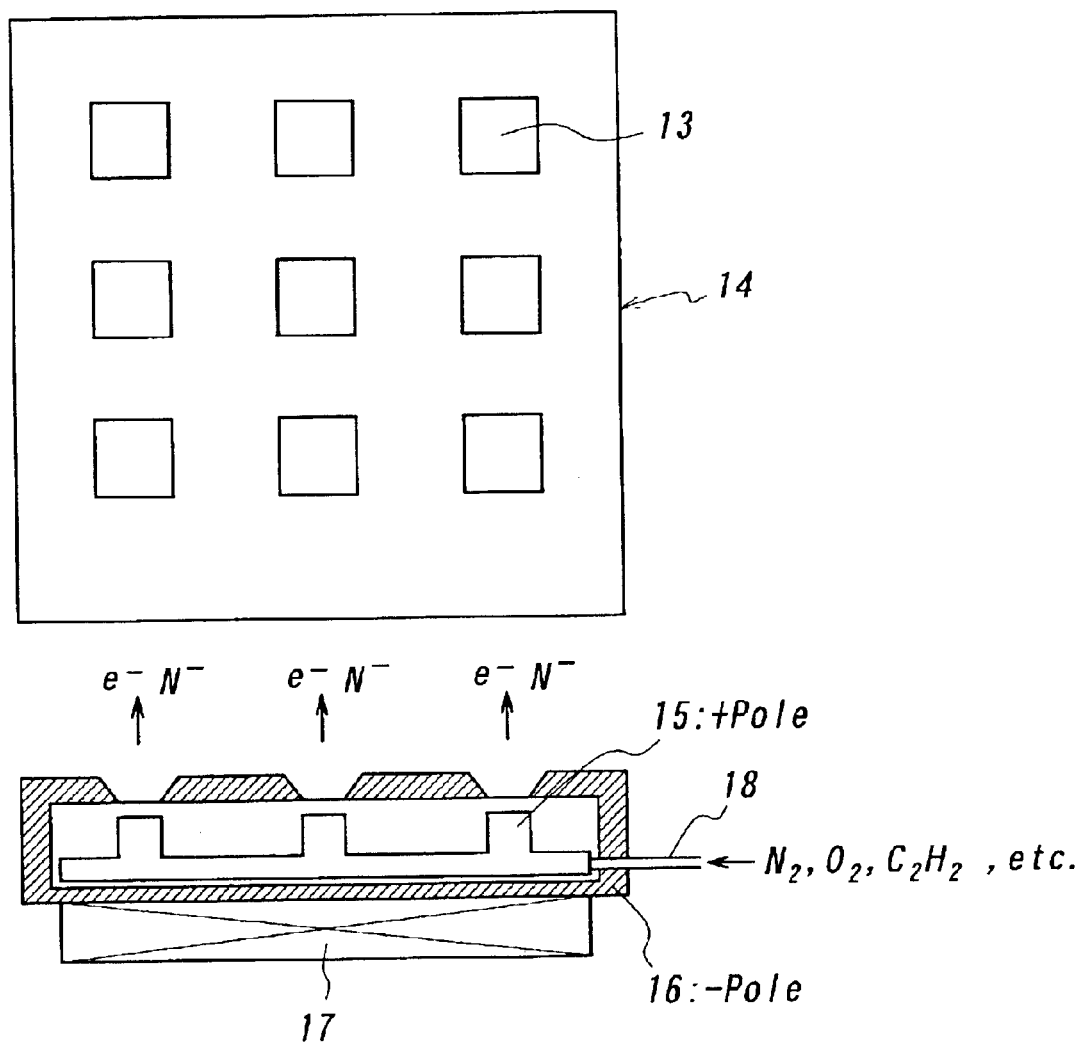
FIG. 2 is a view illustrating another embodiment of the high bias voltage applying apparatus suitable for the invention.
Figure 3:
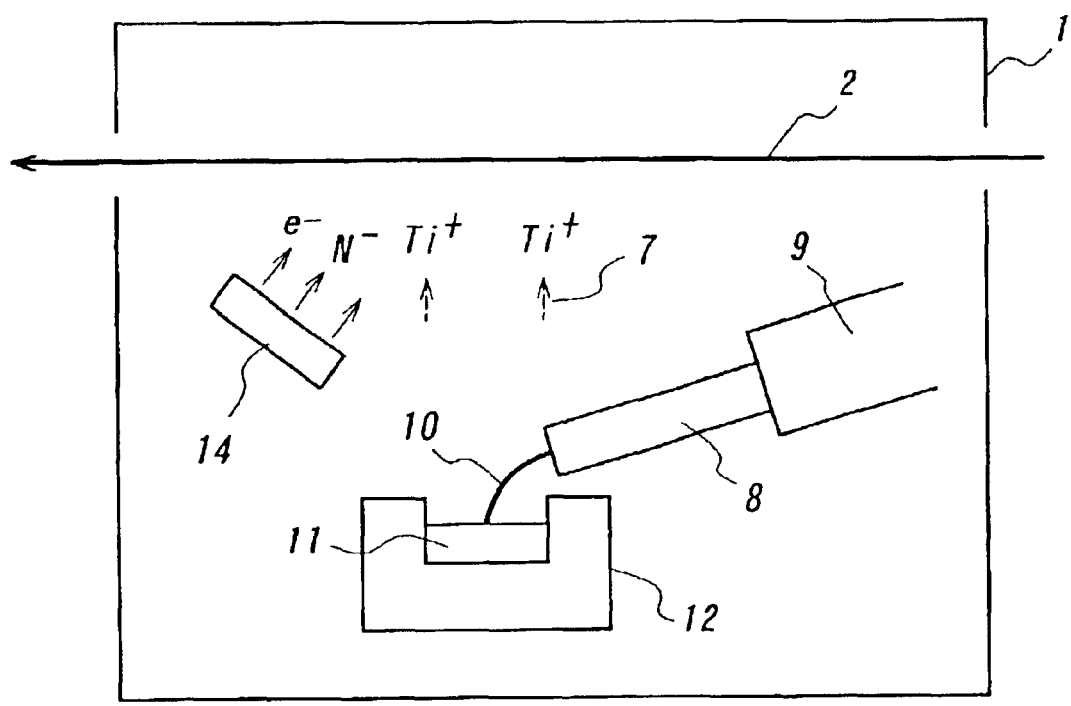
FIG. 3 is a schematic view of a HCD apparatus provided with the another embodiment of the high bias voltage applying apparatus suitable for the invention.
Figure 4:
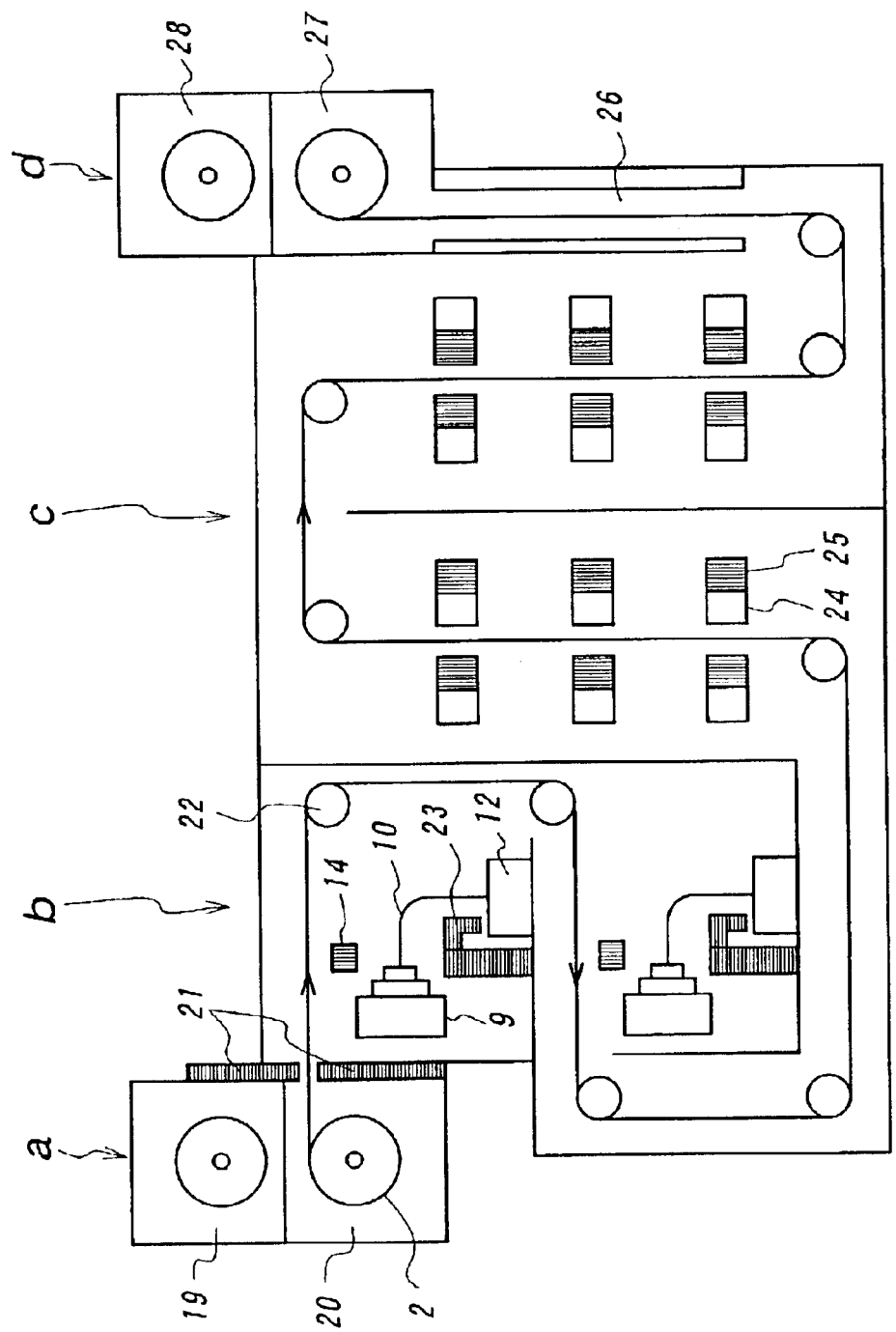
FIG. 4 is a view illustrating a continuous ceramic coating equipment of an in-line system comprising HCD apparatus and magnetron sputtering apparatus (vertical type) suitable for carrying out the invention.

The thus obtained non-coating silicon steel sheet is directly fed to a continuous ion plating apparatus shown in FIG. 4 to form a ceramic coating of two layers.

That is, TiNO coating of 0.1 $\mu$m in thickness is first pre-coated by the HCD process under an application of a high-bias voltage of –250 V onto the steel sheet substrate, and then $SiN_x$ coating of 0.2 $\mu$m in thickness is formed by the magnetron sputtering process.

Thereafter, an insulating coating composed mainly of a phosphate and colloidal silica is applied and dried and then subjected to a baking treatment at 815° C. in nitrogen atmosphere for 1 minute and further to a stress relief annealing at 800° C. in nitrogen atmosphere for 3 hours.

The thus obtained grain-oriented silicon steel sheet provided with the insulating coating is measured with respect to the magnetic properties and coating adhesion property (180° bending diameter).

For the comparison, the same measurements are made with respect to steel sheet prepared by pre-coating TiN coating of 0.1 $\mu$m onto the surface of the non-coating silicon steel sheet through the HCD process without applying bias voltage and forming $SiN_x$ coating of 0.2 $\mu$m through the magnetron sputtering process according to the usual production method of the grain-oriented silicon steel sheet and similarly subjecting to stress relief annealing at 800° C. in nitrogen atmosphere for 3 hours.

The measured results are shown by comparison as follows:

(A) Application of high bias voltage of –250 V (TiNO coating)

Magnetic flux density $B_8$: 1.90 T

Iron loss $W_{17/50}$: 0.54 W/kg

Adhesion property: no peeling in bending of 15 mmφ

(B) No application of bias voltage (TiN coating)

Magnetic flux density $B_8$: 1.90 T

Iron loss $W_{17/50}$: 0.68 W/kg

Adhesion property: no peeling in bending of 50 mmφ

Further, a steel sheet after the pickling treatment of the above non-coating silicon steel sheet and a steel sheet further subjected to a chemical polishing treatment to render the surface into smooth surface are pre-coated with TiNO coating (thickness 0.1 μm) under an application of high bias voltage in the same manner as mentioned above, then $SiN_x$ coating (thickness 0.2 μm) is formed through the magnetron sputtering process, further then a phosphate insulating coating is formed thereon, and then subjected to stress relief annealing. The magnetic properties and coating adhesion property (180° bending diameter) are measured with respect to the resultant steel sheets, whereby the following results are obtained.

(C) Only pickling treatment

Magnetic flux density $B_8$: 1.89 T

Iron loss $W_{17/50}$: 0.60 W/kg

Adhesion property: no peeling in bending of 20 mmφ

(D) Presence of smoothening treatment

Magnetic flux density $B_8$: 1.91 T

Iron loss $W_{17/50}$: 0.50 W/kg

Adhesion property: no peeling in bending of 15 mmφ

Example 2

A continuously cast slab of silicon steel having a composition of C: 0.071 mass %, Si: 3.39 mass %, Mn: 0.071 mass %, Se: 0.020 mass %, Sb: 0.025 mass %, Al: 0.021 mass %, N: 0.0079 mass %, Mo: 0.012 mass % and the reminder being Fe and inevitable impurities is heated at 1350° C. for 3 hours and subjected to a hot rolling to obtain a hot rolled sheet having a thickness of 2.0 mm. Then, the hot rolled sheet is subjected to homogenizing at 1050° C. and further to two cold rollings sandwiching an intermediate annealing at 1050° C. to obtain a cold rolled sheet having a thickness of 0.23 mm.

Next, an etching resist ink composed mainly of an alkyd resin is applied onto the surface of the cold rolled sheet by a gravure off-set printing so as to linearly leave non-applied portions in a direction substantially perpendicular to the rolling direction at a width of 200 μm and an interval in the rolling direction of 4 mm and baked at 200° C for about 20 seconds. In this case, the thickness of the resist is 2 μm. The steel sheet coated with the etching resist is subjected to an electrolytic etching to form linear grooves having a width of 200 μm and a depth of 20 μm and then immersed in an organic solvent to remove the resist. In this case, the electrolytic etching is carried out in an electrolyte of NaCl under conditions that a current density is 10 A/dm² and a treating time is 20 seconds.

After the decarburization-primary recrystallization annealing is carried out in wet $H_2$ of 840° C., a slurry of an annealing separator having a composition of MgO (25 mass %), $Al_2O_3$ (60 mass %), Si(OH) (10 mass %) and $CaSiO_3$ (5 mass %) is applied onto the surface of the steel sheet. Then, the decarburization-primary recrystallization annealed sheet is annealed at 850° C. for 15 hours and raised from 850° to 1100° C. at a rate of 12° C./h to develop secondary recrystallization grains strongly accumulated in a Goss orientation and subjected to purification annealing in a dry $H_2$ of 1220° C. to prepare a non-coating material.

Figure 5:
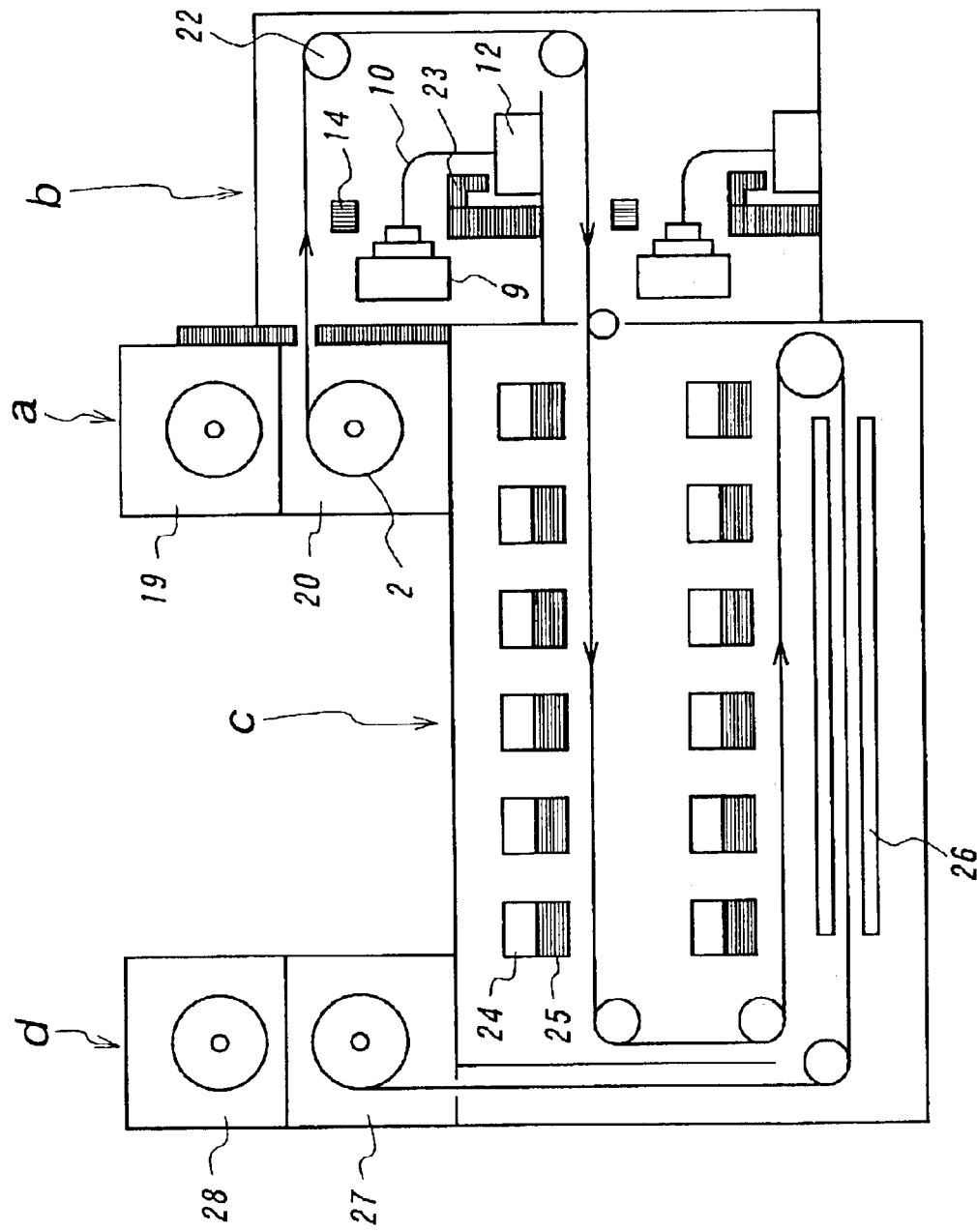
FIG. 5 is a view illustrating a continuous ceramic coating equipment of an in-line system comprising HCD apparatus and magnetron sputtering apparatus (lateral type) suitable for carrying out the invention.
Figure 6A:
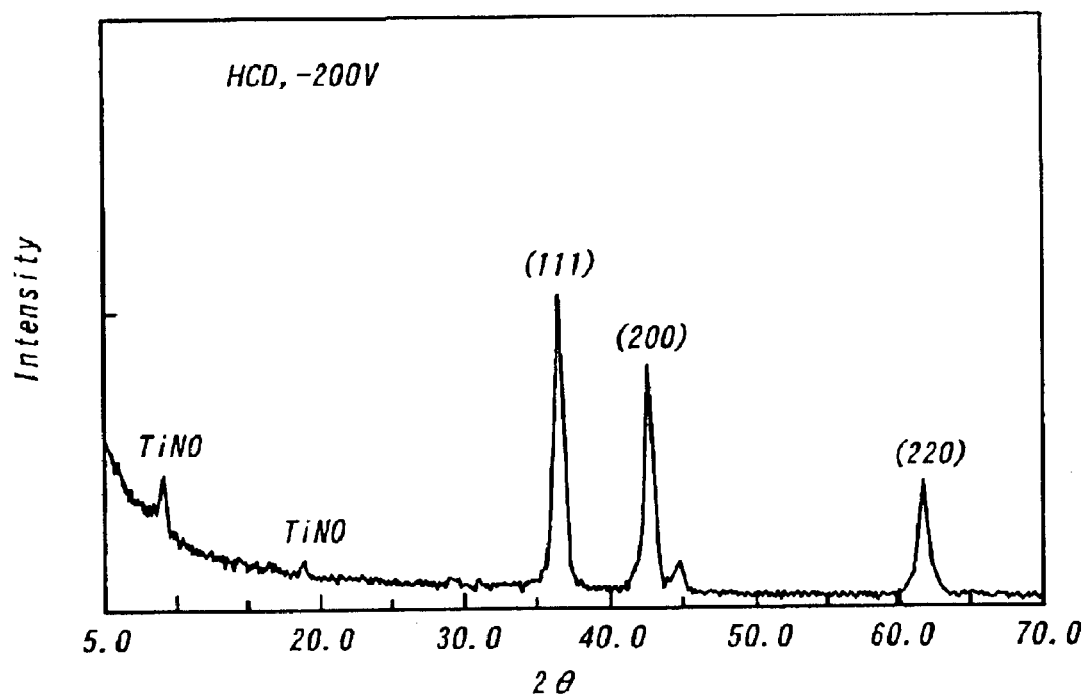
FIG. 6 is a graph showing results measured by an X-ray diffractometry on ceramic coating (a) obtained by applying a high bias voltage of –200 V and ceramic coating (b) obtained without applying bias voltage.
Figure 6B:
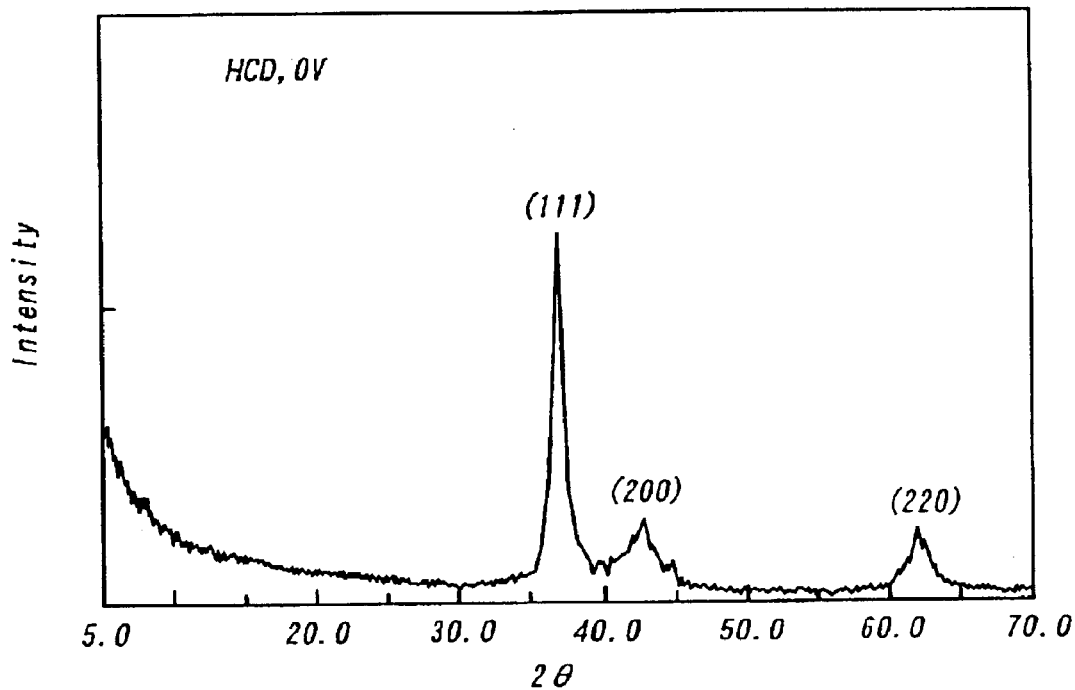
Figure 7:
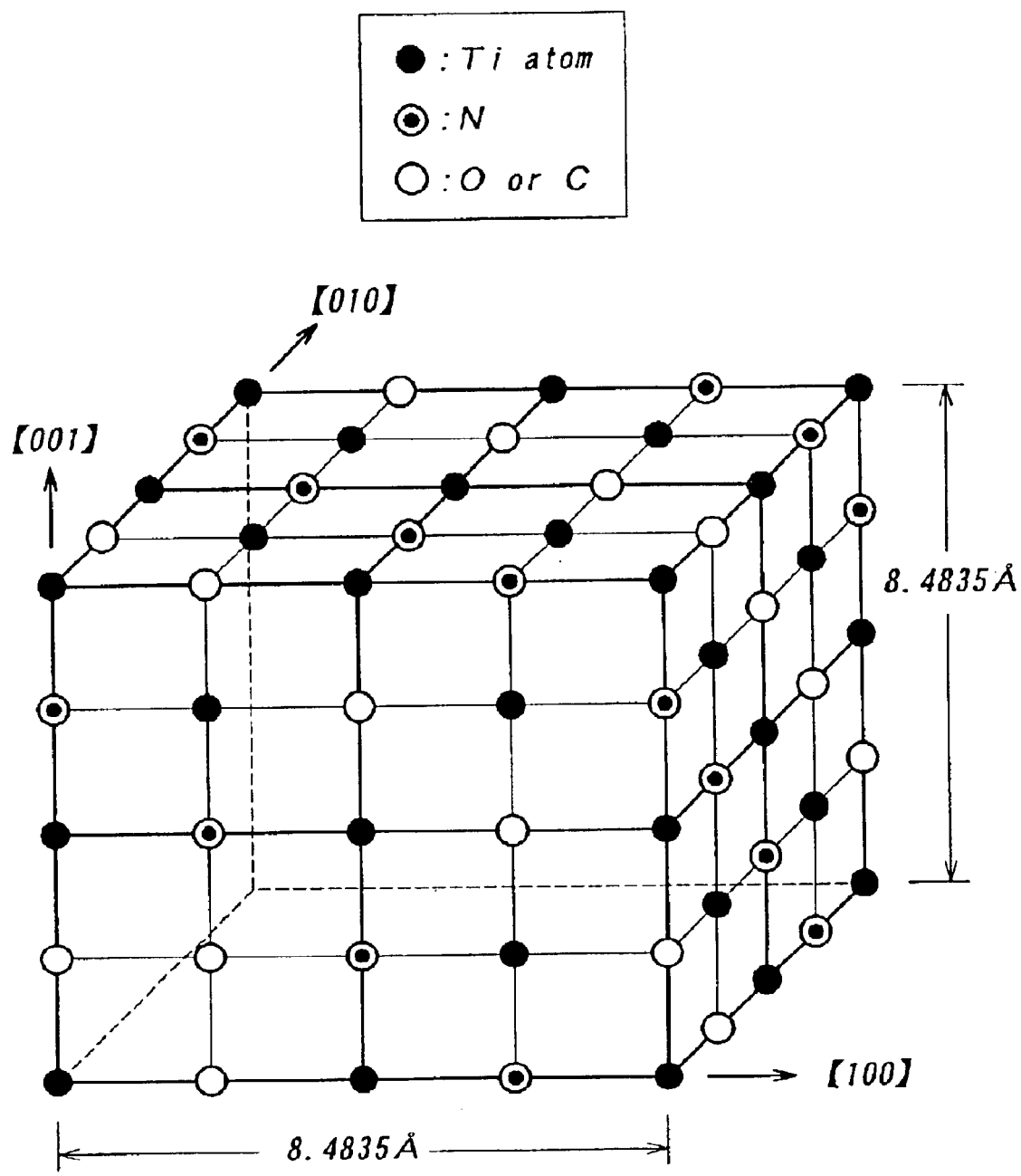
FIG. 7 is a view illustrating a crystal structure of TiNO ceramic tension coating obtained according to the invention.

The thus obtained non-coating silicon steel sheet is directly fed to a continuous ion plating apparatus shown in FIG. 5 to form a ceramic coating of two layers.

That is, TiNO coating of 0.1 μm in thickness is first pre-coated by the HCD process under an application of a high-bias voltage of −150 V onto the steel sheet substrate, and then $SiN_x$ coating of 0.15 μm in thickness is formed by the magnetron sputtering process.

Thereafter, an insulating coating composed mainly of a phosphate and colloidal silica is applied and dried and then subjected to a baking treatment at 815° C. in nitrogen atmosphere for 1 minute and further to a stress relief annealing at 800° C. in nitrogen atmosphere for 3 hours.

The thus obtained grain-oriented silicon steel sheet provided with the insulating coating is measured with respect to the magnetic properties and coating adhesion property (180° bending diameter).

For the comparison, the same measurements are made with respect to steel sheet prepared by pre-coating TiN coating of 0.1 μm onto the surface of the non-coating silicon steel sheet through the HCD process without applying bias voltage and forming $SiN_x$ coating of 0.15 μm through the magnetron sputtering process according to the usual production method of the grain-oriented silicon steel sheet and similarly subjecting to stress relief annealing at 800° C. in nitrogen atmosphere for 3 hours.

The measured results are shown by comparison as follows:

(A) Application of high bias voltage of −150 V (TiNO coating)

Magnetic flux density $B_8$: 1.89 T

Iron loss $W_{17/50}$: 0.56 W/kg

Adhesion property: no peeling in bending of 20 mmφ

(B) No application of bias voltage (TiN coating)

Magnetic flux density $B_8$: 1.89 T

Iron loss $W_{17/50}$: 0.70 W/kg

Adhesion property: no peeling in bending of 50 mmφ

Further, a steel sheet after the pickling treatment of the above non-coating silicon steel sheet and a steel sheet further subjected to a chemical polishing treatment to render the surface into smooth surface are pre-coated with TiNO coating (thickness 0.1 μm) under an application of high bias voltage in the same manner as mentioned above, then $SiN_x$ coating (thickness 0.01 μm) is formed through the magnetron sputtering process, further then a phosphate insulating coating is formed and then subjected to stress relief annealing. The magnetic properties and coating adhesion property (180° bending diameter) are measured with respect to the resultant steel sheets, whereby the following results are obtained.

(C) Only pickling treatment

Magnetic flux density $B_8$: 1.88 T

Iron loss $W_{17/50}$: 0.61 W/kg

Adhesion property: no peeling in bending of 25 mmφ

(D) Presence of smoothening treatment

Magnetic flux density $B_8$: 1.90 T

Iron loss $W_{17/50}$: 0.49 W/kg

Adhesion property: no peeling in bending of 15 mmφ

INDUSTRIAL APPLICABILITY

According to the invention, there can be formed ceramic tension coatings having excellent adhesion property and bending properties even after the heat treatment at high temperatures for a long time and causing no deterioration of iron loss feared in such stress relief annealing.

Therefore, according to the invention can be stably obtained ultra-low iron loss grain-oriented silicon steel sheets having an excellent iron loss property even after the stress relief annealing at high temperatures for a long time.

What is claimed is:

1. An ultra-low iron loss grain-oriented silicon steel sheet having a plurality of ceramic coating layers formed on a surface of a grain-oriented silicon steel sheet after finish annealing, characterized in that said steel sheet has a TiNO coating formed by a hollow cathode discharge process as a first coating layer.

2. An ultra-low iron loss grain-oriented silicon steel sheet having a plurality of ceramic coating layers formed on a surface of a grain-oriented silicon steel sheet after finish annealing, characterized in that said steel sheet has a TiNO coating formed by a hollow cathode discharge process as a first coating layer and further a $SiN_x$ coating formed by a magnetron sputtering process on the TiNO coating.

3. A method of producing an ultra-low iron loss grain-oriented silicon steel sheet by forming a plurality of ceramic coating layers on a surface of a grain-oriented silicon steel sheet after finish annealing without forming a forsterite undercoating on a surface of the steel sheet, characterized in that a TiNO coating is formed on a surface of the as finish annealed steel sheet as a first coating layer by a hollow cathode discharge process under an application of a high bias voltage of not less than −100 V to the steel sheet.

4. A method of producing an ultra-low iron loss grain-oriented silicon steel sheet by forming a plurality of ceramic coating layers on a surface of a grain-oriented silicon steel sheet after finish annealing without forming a forsterite undercoating on a surface of the steel sheet, characterized in that a TiNO coating is formed on a surface of the as finish annealed steel sheet as a first coating layer by a hollow cathode discharge process under an application of a high bias voltage of not less than −100 V to the steel sheet and then a $SiN_x$ coating is formed on the TiNO coating by a magnetron sputtering process.

* * * * *